United States Patent
Kato

(10) Patent No.: US 7,579,875 B2
(45) Date of Patent: Aug. 25, 2009

(54) INTERFACE CIRCUIT AND CONTROL METHOD THEREOF

(75) Inventor: Yoshiharu Kato, Kasugai (JP)

(73) Assignee: Fujitsu Microelectronics Ltd., Tokyo (JP)

( * ) Notice: Subject to any disclaimer, the term of this patent is extended or adjusted under 35 U.S.C. 154(b) by 0 days.

(21) Appl. No.: 11/542,149

(22) Filed: Oct. 4, 2006

(65) Prior Publication Data

US 2007/0216444 A1 Sep. 20, 2007

(30) Foreign Application Priority Data

Mar. 16, 2006 (JP) .............................. 2006-072389

(51) Int. Cl.
*H03K 19/094* (2006.01)
*H03K 19/0175* (2006.01)

(52) U.S. Cl. .............................. 326/86; 326/26; 326/90

(58) Field of Classification Search .................... 326/26, 326/82, 86, 93, 90, 126–127; 327/56, 65, 327/74
See application file for complete search history.

(56) References Cited

U.S. PATENT DOCUMENTS

| 5,856,750 | A  | * | 1/1999 | Koseki ........................ 327/72 |
| 6,753,701 | B2 | * | 6/2004 | Chang ......................... 326/93 |
| 6,798,264 | B2 | * | 9/2004 | Swanson et al. ............ 327/205 |
| 2005/0134340 | A1 | * | 6/2005 | Lee ............................. 327/172 |

FOREIGN PATENT DOCUMENTS

JP 9-213884 A 8/1997

* cited by examiner

*Primary Examiner*—Anh Q Tran
(74) *Attorney, Agent, or Firm*—Arent Fox LLP

(57) ABSTRACT

This invention provides an interface circuit for detecting that a DQS signal from a DDR SDRAM is at an intermediate potential. An interface circuit is connected to at least a signal line which transmits the DQS signal from the DDR SDRAM and reaches an intermediate potential VM when the signal attains an inactive state. The interface circuit has a comparing portion for comparing the potential of the DQS with a threshold potential VREFH which is a potential that is different from the intermediate potential VM.

19 Claims, 9 Drawing Sheets

CIRCUIT DIAGRAM ILLUSTRATING STRUCTURE OF INTERFACE CIRCUIT ACCORDING TO FOURTH EMBODIMENT

FIG.1 CIRCUIT DIAGRAM ILLUSTRATING STRUCTURE OF INTERFACE CIRCUIT ACCORDING TO FIRST EMBODIMENT

FIG.3 CIRCUIT DIAGRAM ILLUSTRATING STRUCTURE OF INTERFACE CIRCUIT ACCORDING TO SECOND EMBODIMENT

TIMING CHART ILLUSTRATING OPERATION OF INTERFACE CIRCUIT ACCORDING TO SECOND EMBODIMENT

FIG.5 CIRCUIT DIAGRAM ILLUSTRATING STRUCTURE OF INTERFACE CIRCUIT ACCORDING TO THIRD EMBODIMENT

TIMING CHART ILLUSTRATING OPERATION OF INTERFACE CIRCUIT ACCORDING TO THIRD EMBODIMENT

FIG.7 CIRCUIT DIAGRAM ILLUSTRATING STRUCTURE OF INTERFACE CIRCUIT ACCORDING TO FOURTH EMBODIMENT

TIMING CHART ILLUSTRATING OPERATION OF INTERFACE CIRCUIT ACCORDING TO FOURTH EMBODIMENT

CIRCUIT DIAGRAM ILLUSTRATING INPUT BUFFER CIRCUIT OF CONVENTIONAL ART

INTERFACE CIRCUIT AND CONTROL METHOD THEREOF

CROSS-REFERENCE TO RELATED APPLICATIONS

This application is based upon and claims the benefit of priority from the prior Japanese Patent Application No. 2006-072389 filed on Mar. 16, 2006, the entire contents of which are incorporated herein by reference.

BACKGROUND OF THE INVENTION

1. Field of the Invention

The present invention relates to technology for an interface circuit which is connected to a signal line reaching an intermediate potential when a signal transmitted from an external circuit attains an inactive state, more particularly to an interface circuit which is connected to a signal for transmitting a strobe signal from a double data rate synchronous dynamic random access memory (DDR SDRAM).

2. Description of Related Art

In the reading action of the DDR SDRAM, data is outputted to a memory bus from the DDR SDRAM synchronously with an edge of a data strobe signal DQS. When at this time the data strobe signal is in an inactive state, the output side terminal attains a high impedance state. A terminal resistor is connected to a signal line for transmitting the data strobe signal DQS and when the output side terminal attains a high impedance state, the potential of the signal line adopts an intermediate potential on the basis of a proportional division of the terminal resistor in terms of the velocity of transition of the state of the data strobe signal DQS.

On the other hand, a device for acquiring data outputted onto a memory bus synchronously with an edge of the data strobe signal DQS needs to acquire data by means of the data strobe signal DQS in a state other than the intermediate potential, that is, in an active state of either logic-high level or a logic-low level. A signal line at an intermediate potential maintains its potential with only the terminal resistor, so that a level of signal is likely to become unstable because common noise is also present. If a data strobe signal DQS in such a state is used as a clock for acquisition of data, there is a real danger that acquisition errors will occur.

A requirement for avoiding this problem is to detect that the signal line for transmitting the data strobe signal DQS is at an intermediate potential, and, in accordance with the results of such a detection, to interrupt propagation of a signal from the signal line.

In order to detect the state of a signal line for transmitting the data strobe signal DQS, that is, to detect whether or not the signal line is at an intermediate potential, one possibility is to adopt the technology of a semiconductor integrated circuit disclosed in Japanese Unexamined Patent Publication No. H9(1997)-213884.

FIG. 9 illustrates a circuit diagram showing an input buffer portion 152 in the semiconductor integrated device disclosed in the Japanese Unexamined Patent Publication No. H9(1997)-213884.

By means of comparing with reference voltage Vref the potential of signal lines a and b for transmitting signals that have been inputted from outside, and that are of a level complementary to each other, the input buffer portion 152 can detect whether or not the output terminal which drives signal lines a and b is in a high impedance state.

When this semiconductor integrated device detects that the output terminal of the input buffer portion 152 is in a high impedance state, propagation of signals transmitted through the signal lines a and b, and in accordance with the results of the detection, is interrupted. Consequently, malfunctioning of a circuit can be prevented at a subsequent stage in which used a signal transmitted through signals lines a and b are as an acquisition clock.

SUMMARY OF THE INVENTION

If the art disclosed in the Japanese Unexamined Patent Publication No. H9(1997)-213884 is adopted to detect the state of the data strobe signal DQS, the data strobe signal DQS and the data strobe signal XDQS, which is a signal complementary to the data strobe signal DQS, are inputted to the signal lines a and b.

However, according to the art of the Japanese Unexamined Patent Publication No. H9(1997)-213884, when signal lines a and b are switched to an intermediate potential, the output of the sense amplifier 114 and the sense amplifier 115 becomes uncertain, or, if the reference voltage Vref is lower than the intermediate potential, can take a high level. Consequently, a potential other than low level is outputted. Thus, the states of the signal lines a and b cannot be accurately detected and since the intermediate potential also affects subsequent stages, a problem arises.

The present invention has been achieved in view of the above-described background art, and an object of the invention is to provide an interface circuit for detecting that the potential of a signal line is at an intermediate potential.

In order to achieve the above object, there is provided an interface circuit for transmitting a signal from an external circuit and connected to at least a signal line which reaches an intermediate potential when the signal attains an inactive state, comprising a comparing portion for comparing a potential of the signal line with a threshold potential which is a potential that is different from the intermediate potential.

Further, there is provided a control method for an interface circuit for transmitting a signal from an external circuit and connected to at least a signal line which reaches an intermediate potential when the signal attains an inactive state, comprising a step of recognizing that a potential of the signal line is an intermediate potential and a step of comparing the potential of the signal line with a threshold potential which is a potential that is different from the intermediate potential.

In the interface circuit of the present invention, a comparing portion compares the potential of a signal line, at an intermediate potential when it is in inactive state, with a threshold potential which is a potential that is different from the intermediate potential. Whether or not the signal line is at the intermediate potential can be reliably detected on the basis of the results of a comparison, by determining that the potential of the signal line exceeds the threshold potential.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, the preferred embodiments of a semiconductor storage device of the present invention will be described in detail with reference to FIGS. 1-8.

First Embodiment

Figure 1:
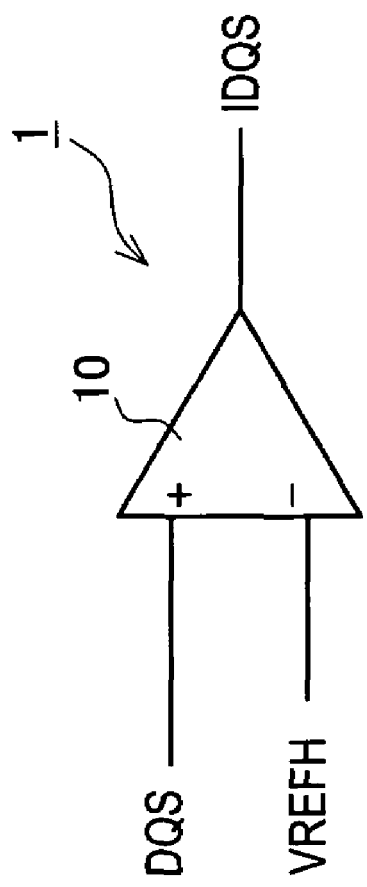
FIG. 1 is a circuit diagram illustrating the structure of an interface circuit according to a first embodiment.

FIG. 1 is a circuit diagram illustrating the structure of an interface circuit 1 according to the first embodiment.

At a time of reading action, the DDR SDRAM outputs from its output terminal a strobe signal which reaches either a high level potential VH or a low level potential VL, and the output terminal takes a high impedance state at times other than the reading action. A terminal resistor is connected to a signal line transmitting the strobe signal DQS, and when the output terminal is in a high impedance state, on the basis of a proportional division of the terminal resistor the potential of the strobe signal DQS assumes an intermediate potential VM. When a strobe signal DQS is inputted from the DDR SDRAM to the interface circuit 1, it outputs a low level if the strobe signal DQS is of an intermediate potential VM, or of a low level, and when the strobe signal DQS is of a high level, it outputs a high level. The internal strobe signal IDQS generated here serves as a clock signal for acquisition of data from the DDR SDRAM.

The interface circuit 1 includes a comparator 10. In this comparator 10, a strobe signal DQS is connected to its non-inverting terminal (+), and a high potential side threshold potential VREFH is connected to an inverting terminal (−). The high potential side threshold potential VREFH is set to a potential that is higher than the intermediate potential VM.

A threshold potential generating circuit for generating the high potential side threshold potential VREFH can be constituted, for example, of a resistance type potential dividing circuit. A high potential side threshold potential VREFH that is higher than the intermediate potential VM can be obtained by setting the proportional division ratio of the resistor so that a proportionally divided potential is higher than the proportional division ratio of a terminal resistor connected to the signal line transmitting the strobe signal DQS. This threshold potential generating circuit may be a capacity type potential dividing circuit, as well as a resistance type potential dividing circuit.

The high potential side threshold potential VREFH may be an intermediate potential between a high level potential VH and an intermediate potential VM. The reason for this is that a margin between the high level potential VH and the high potential side threshold potential VREFH becomes equal to a margin between the intermediate potential VM and the high potential side threshold potential VREFH, and it can thus be determined whether in relation to the high potential side threshold potential VREFH the strobe signal DQS is on the side of the high level potential VH or on the side of the intermediate potential VM.

Figure 2:
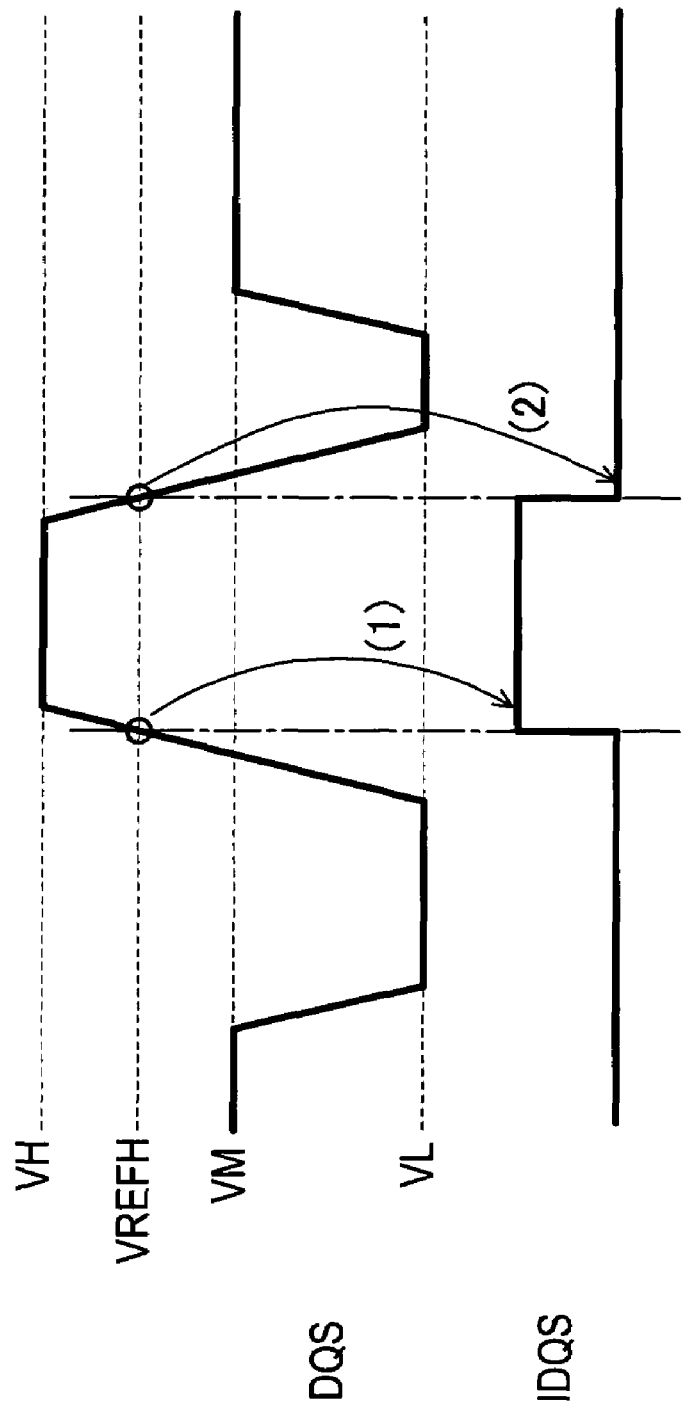
FIG. 2 is a timing chart illustrating the operation of an interface circuit according to the first embodiment.

An operation of the interface circuit 1 according to the first embodiment will now be described. FIG. 2 is a timing chart showing the operation of the interface circuit 1 according to the first embodiment.

When the strobe signal DQS is between the intermediate potential VM and the low level potential VL, because the potential of the comparator 10 is lower than the high potential side threshold potential VREFH, the comparator 10 outputs a low level signal as the internal strobe signal IDQS.

If as in (1) the strobe signal DQS is switched from a high potential side threshold potential VREFH to a high potential side, the internal strobe signal IDQS is switched to a high level. If as in (2) the strobe signal DQS is switched from the high potential side threshold potential VREFH to a low potential side, the internal strobe signal IDQS is switched to a low level.

In the interface circuit 1 of the first embodiment, the comparator 10 compares the potential of a strobe signal DQS, which reaches an intermediate potential VM when it turns into an inactive state, with the high potential side threshold potential VREFH, which is a potential that is different from the intermediate potential VM. Whether or not the strobe signal DQS is at the intermediate potential VM can be detected accurately by determining on the basis of the results of a comparison that the potential of the strobe signal DQS does exceed the high potential side threshold potential VREFH.

In the interface circuit 1, the high potential side threshold potential VREFH is set to a higher potential than the intermediate potential VM. When the strobe signal DQS reaches a high level potential VH, a high level signal is outputted to the internal strobe signal IDQS. In other word, because a logical high level of strobe signal DQS is propagated in an active state, an internal strobe signal IDQS can be generated without the necessity for other circuits, and the configuration of a circuit can thereby be simplified.

Second Embodiment

Figure 3:
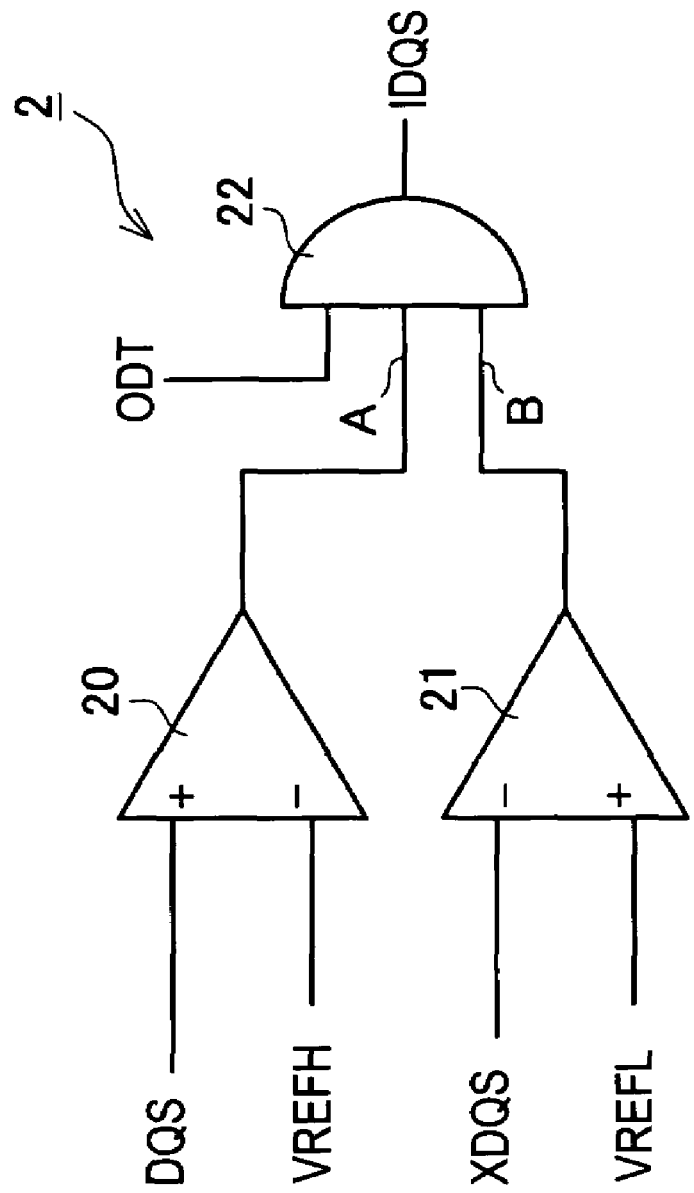
FIG. 3 is a circuit diagram illustrating the structure of an interface circuit according to a second embodiment.

Next, an interface circuit 2 of the second embodiment will be described. FIG. 3 is a circuit diagram showing the structure of the interface circuit 2 of the second embodiment. In the same way as the interface circuit 1 of the first embodiment, the interface circuit 2 receives an input of the strobe signal DQS, and when the strobe signal DQS is of an intermediate potential VM, or of a low level, a low level signal is outputted as the internal strobe signal IDQS; and when the strobe signal DQS is of a high level, a high level signal is outputted as the internal strobe signal IDQS.

The interface circuit 2 comprises a first comparator 20, a second comparator 21 and a 3-input AND gate 22. In the first comparator 20, the strobe signal DQS is connected to the non-inverting terminal (+) and the high potential side threshold potential VREFH is connected to the inverting terminal (−). In the second comparator 21, an inverting strobe signal XDQS, which is a signal of a level complementary to the strobe signal DQS, is connected to the inverting terminal (−) while the low potential side threshold potential VREFL is connected to the non-inverting terminal (+).

In the 3-input AND gate 22, a determination control signal ODT inputted from outside is connected to a first input terminal, an output of the first comparator 20 is connected to a second input terminal and an output of the second comparator 21 is connected to a third input terminal.

The low potential side threshold potential VREFL is set to a potential that is lower than the intermediate potential VM. A threshold potential generating circuit for generating the high potential side threshold potential VREFH can be constituted of a resistor type potential dividing circuit. A low potential side threshold potential VREFL that is lower than the intermediate potential VM can be reliably obtained by setting the proportional division ratio of the resistor in such a way that the proportionally divided potential is lower than the proportional division ratio of the terminal resistor connected to a signal line transmitting the strobe signal DQS. The threshold potential generating circuit may be a capacity type potential dividing circuit, as well as a resistor type potential dividing circuit.

The low potential side threshold potential VREFL may be an intermediate potential between the low level potential VL and the intermediate potential VM. The margin between the low level potential VL and the low potential side threshold potential VREFL becomes equal to the margin between the intermediate potential VM and the low potential side threshold potential VREFL, so that it can be determined accurately whether in relation to the low potential side threshold potential VREFL the strobe signal DQS is on the side of the low level potential VL or on the side of the intermediate potential VM.

Figure 4:
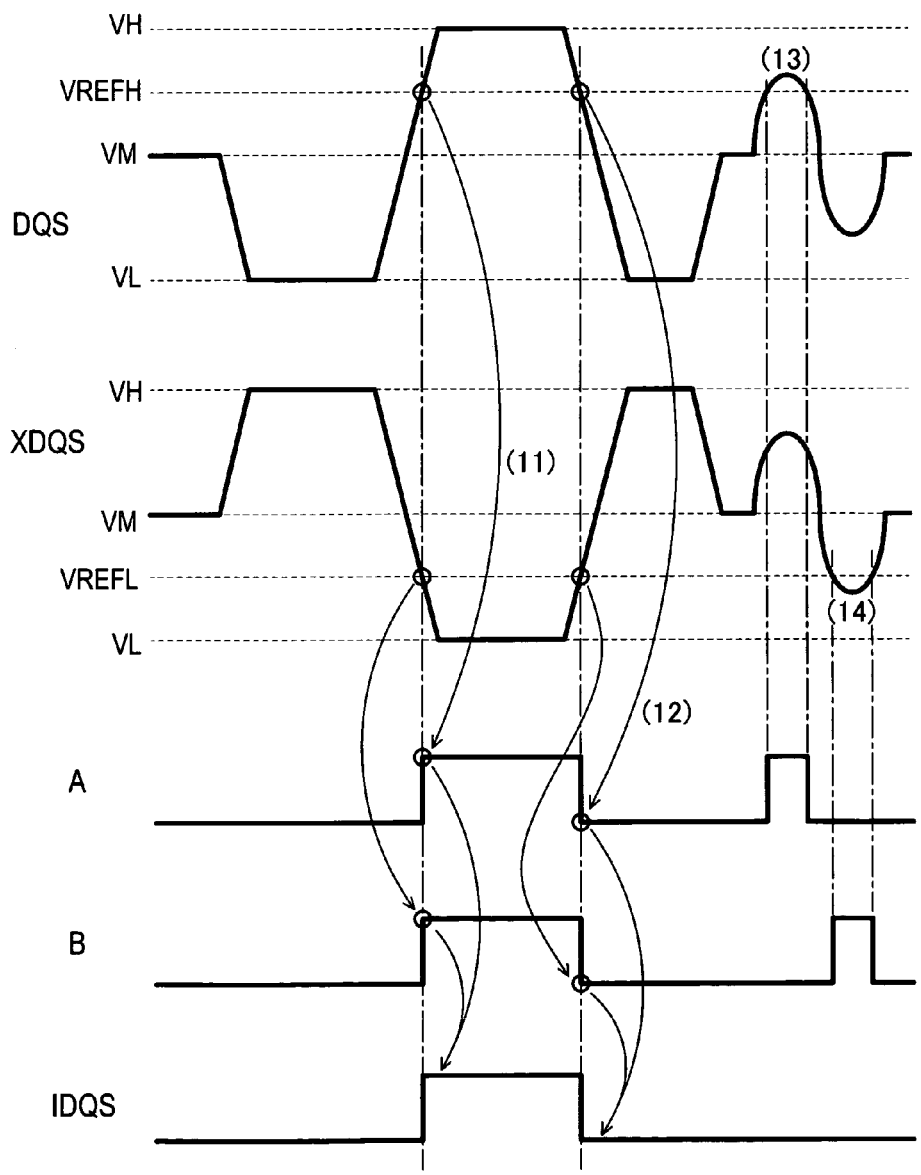
FIG. 4 is a timing chart illustrating the operation of the interface circuit according to the second embodiment.

Next, an operation of the interface circuit 2 according to the second embodiment will be described. FIG. 4 is a timing chart illustrating the operation of the interface circuit 2 of the second embodiment.

In a first comparator 20, the strobe signal DQS is compared with the high potential side threshold potential VREFH, and when the strobe signal DQS is of higher potential than the high potential side threshold potential VREFH, a high level is outputted as output A. In a second comparator 21, the inverting strobe signal XDQS is compared with the low potential side threshold potential VREFL, and, if the inverting strobe signal XDQS is of lower potential than the low potential side threshold potential VREFL, a high level is outputted as output B. Therefore, when the strobe signal DQS is on the intermediate potential VM, and on the low level potential VL at the left side of FIG. 4, a low level is outputted as output A and, if the inverting strobe signal XDQS is on the intermediate potential VM and on the high level potential VH, a low level is outputted as the output B.

If as in (11) the potential of the strobe signal DQS is higher than the high potential side threshold potential VREFH, output A is changed to a high level, and if the inverting strobe signal XDQS is lower than the low potential side threshold potential VREFL, output B is changed to high level. If the determination control signal ODT of the 3-input AND gate 22 is of a high level, a high level is outputted as the internal strobe signal IDQS.

If the potential of the strobe signal DQS is lower than the high potential side threshold potential VREFH, output A is switched to a low level; and if the potential of the inverting strobe signal XDQS is higher than the low potential side threshold potential VREFL, output B is switched to a low level. When the determination control signal ODT of the 3-input AND gate 22 is of a high level, the internal strobe signal IDQS, which is an output of the 3-input AND gate 22, is changed to a low level.

Next, a case will be described where the output terminals which drive the strobe signal DQS and the inverting strobe signal XDQS become a high impedance state so that common noise is overlaid on a signal line transmitting the strobe signal DQS and the inverting strobe signal XDQS.

If, due to common noise, as in (13), the potential of a signal line for transmitting the strobe signal DQS and the inverting strobe signal XDQS exceeds a high potential side threshold potential VREFH, output A is switched to a high level while output B is maintained at a low level. Thus, the internal strobe signal IDQS, which is an output of the 3-input AND gate 22, maintains a low level.

If, due to the common noise, as in (14), the potential of a signal line for transmitting the strobe signal DQS and the inverting strobe signal XDQS drops below the low potential side threshold potential VREFL, output B is switched to a high level while output A maintains a low level. Thus, the internal strobe signal IDQS, which is an output of the 3-input AND gate 22 maintains a low level.

In the interface circuit 2 of the second embodiment as described above, the output terminal for driving the strobe signal DQS and the inverting strobe signal XDQS takes a high impedance state and then, even if, due to common mode noise, the amplitude of the intermediate potential VM exceeds the high potential side threshold potential VREFH, or the low potential side threshold potential VREFL, the internal strobe signal IDQS maintains a low level. Accordingly, without being affected by common mode noise, the interface circuit 2 can detect that the potential of a signal line which transmits the strobe signal DQS and the inverting strobe signal XDQS is the intermediate potential VM. Consequently, a clock for acquisition of the outputted internal strobe signal IDQS can reliably acquire in data of the DDR SDRAM.

If the determination control signal ODT is of a high level, depending on the results of the first comparator 20 and the second comparator 21 the 3-input AND gate 22 is actuated and if the determination control signal ODT is of a low level, it outputs a low level to the internal strobe signal IDQS so as to block an operation thereof. In other words, depending on an input of the determination control signal ODT, the interface circuit 2 can control a detection action of the strobe signal DQS and the inverting strobe signal XDQS.

Third Embodiment

Figure 5:
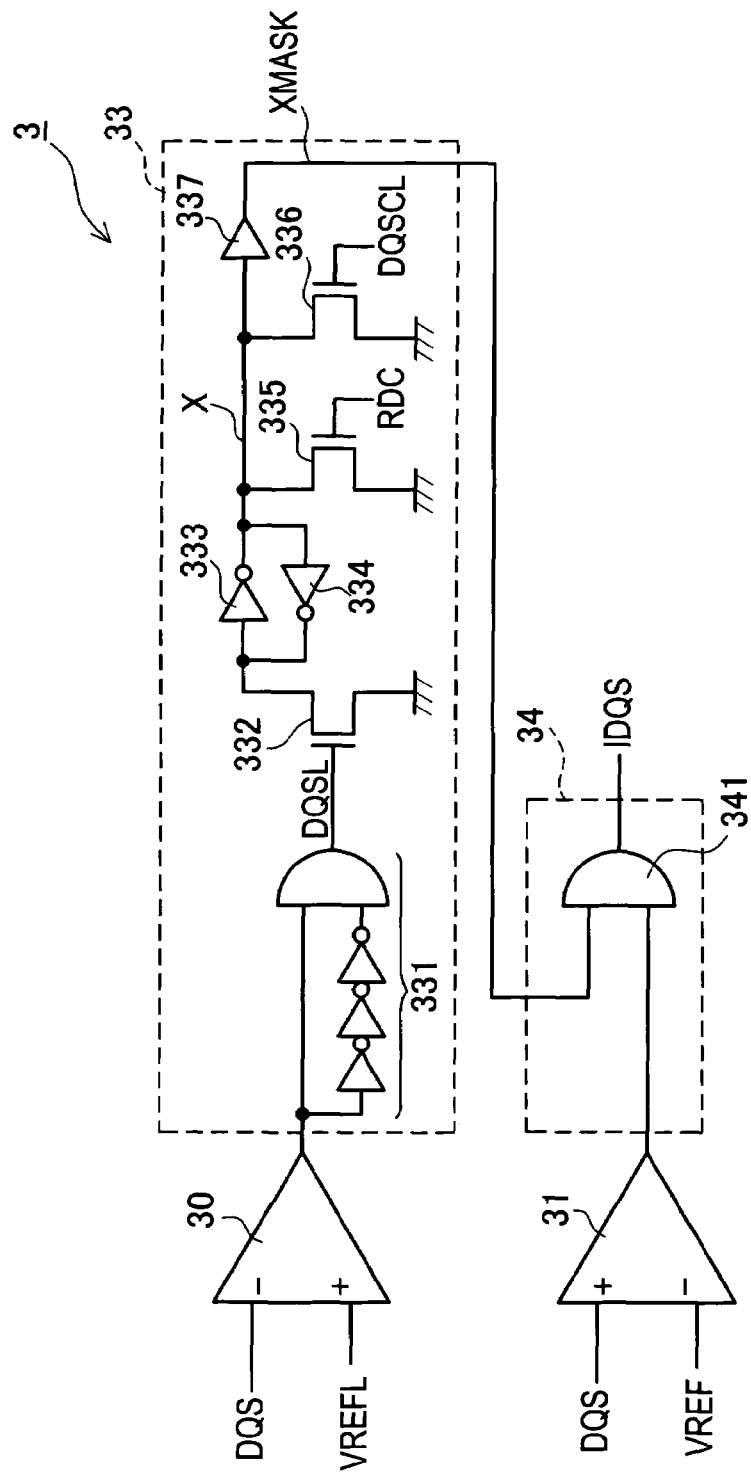
FIG. 5 is a circuit diagram illustrating the structure of an interface circuit according to a third embodiment.

The interface circuit 3 of the third embodiment will now be described. FIG. 5 is a circuit diagram illustrating the structure of the interface circuit of the third embodiment. The interface circuit 3 is a circuit which uses the strobe signal as an input, and during as periods in which the strobe signal DQS reaches an intermediate potential VM outputs an internal strobe signal IDQS in which the propagation of the strobe signal DQS has been interrupted.

The interface circuit 3 comprises a comparator 30, a propagation control signal generating portion 33 which, using as inputs a read instruction signal RDC inputted from outside and a propagation control release signal DQSCL, outputs a propagation control signal XMASK; as inputs, comparator 31 which compares a threshold potential VREF with the strobe signal DQS; and a propagating portion 34 which propagates an output of the input comparator 31.

In the comparator 30, the strobe signal DQS is connected to the inverting input terminal (−), and the low potential side threshold potential VREFL is connected to the non-inverting input terminal (+). Consequently, if the strobe signal DQS drops below the low potential side threshold potential VREFL, the comparator 30 outputs high level.

In this context, as in the case of the low potential side threshold potential VREFL of the second embodiment the low potential side threshold potential VREFL is set to a potential that is lower than the intermediate potential VM. As in the case of the low potential side threshold potential VREFL of the second embodiment, the low potential side threshold potential VREFL is preferably of an intermediate potential between the intermediate potential VM and the low level potential VL.

In the input comparator 31, the strobe signal DQS is inputted to the non-inverting input terminal (+) and the threshold potential VREF is inputted to the inverting input terminal (−). The threshold potential VREF may be any threshold potential as long as it can determine whether the strobe signal DQS is of low level potential VL or of high level potential VH, and as long as it can also be set to, for example, the intermediate potential VM. If the threshold potential VREF is set to the intermediate potential VM, whenever the strobe signal DQS reaches a high level potential VH, or a low level potential VL, the duty ratio of the strobe signal DQS is preferably accurately reflected to a waveform outputted from the input comparator 31.

The propagation control signal generating portion 33 comprises a one-shot pulse generating portion 331; inverters 333 and 334, which are cross-coupled with each other; and an NMOS transistor 332 in which an input side of the inverter 333 is connected to a drain thereof, a strobe edge signal DQSL, which is an output of the one-shot pulse generating portion 331, is connected to a gate thereof, and a grounding potential GND is connected to a source thereof. Further, an output of the inverter 333 is connected to an internal node X. The propagation control signal generating portion 33 further comprises an NMOS transistor 335 in which an internal node X is connected to a drain, a read instruction signal RDC is connected to a gate and a grounding potential GND is connected to a source thereof; an NMOS transistor 336 in which the internal node X is connected to a drain, a propagation control release signal DQSCL is connected to a gate and a grounding potential GND is connected to a source thereof; and a buffer 337 which buffers the potential of the internal node X so as to output a propagation control signal XMASK.

If the read instruction signal RDC or the propagation control release signal DQSC is changed to a high level, either the NMOS transistor 335 or the NMOS transistor 336 turns conductive so that the potential of the internal node X is switched to a low level. Further, the propagation control signal XMASK is also switched to a low level. Consequently, the output of the inverter 333 becomes of a low level and the output of the inverter 334 becomes of a high level and then, these conditions are maintained.

The propagation control release signal DQSCL is generated so as to count a trailing edge of the strobe signal DQS, or the internal strobe signal IDQS, and when that count value reaches a predetermined level that has been established to advance, output a high level. In data transmission at times of reading the DDR SDRAM, because the pulse count of the strobe signal DQS is set to a constant burst length, the propagation control release signal DQSCL can be generated with such a configuration.

On the other hand, if a high level is outputted to the comparator 30, a strobe edge signal DQSL with a pulse width corresponding to a delay time of a series connected inverter is outputted in the one-shot pulse generator 331. Consequently, the NMOS transistor 332 turns conductive so that the input level of the inverter 333 becomes of a low level and then, the output of the inverter 333 becomes of a high level while the output of the inverter 334 becomes of a low level, and this conditions are maintained.

In other words, the propagation control signal generating portion 33 constitutes a flip-flop which is set when in the comparator 30 the strobe signal DQS exceeds the low potential side threshold potential VREFL from the intermediate potential VM, and is then reset in accordance with the propagation control release signal DQSCL.

The propagating portion 34 includes an AND gate 341, which, when the propagation control signal XMASK is of a high level, propagates a signal outputted from the input comparator 31 and then outputs that signal as the internal strobe signal IDQS.

Figure 6:
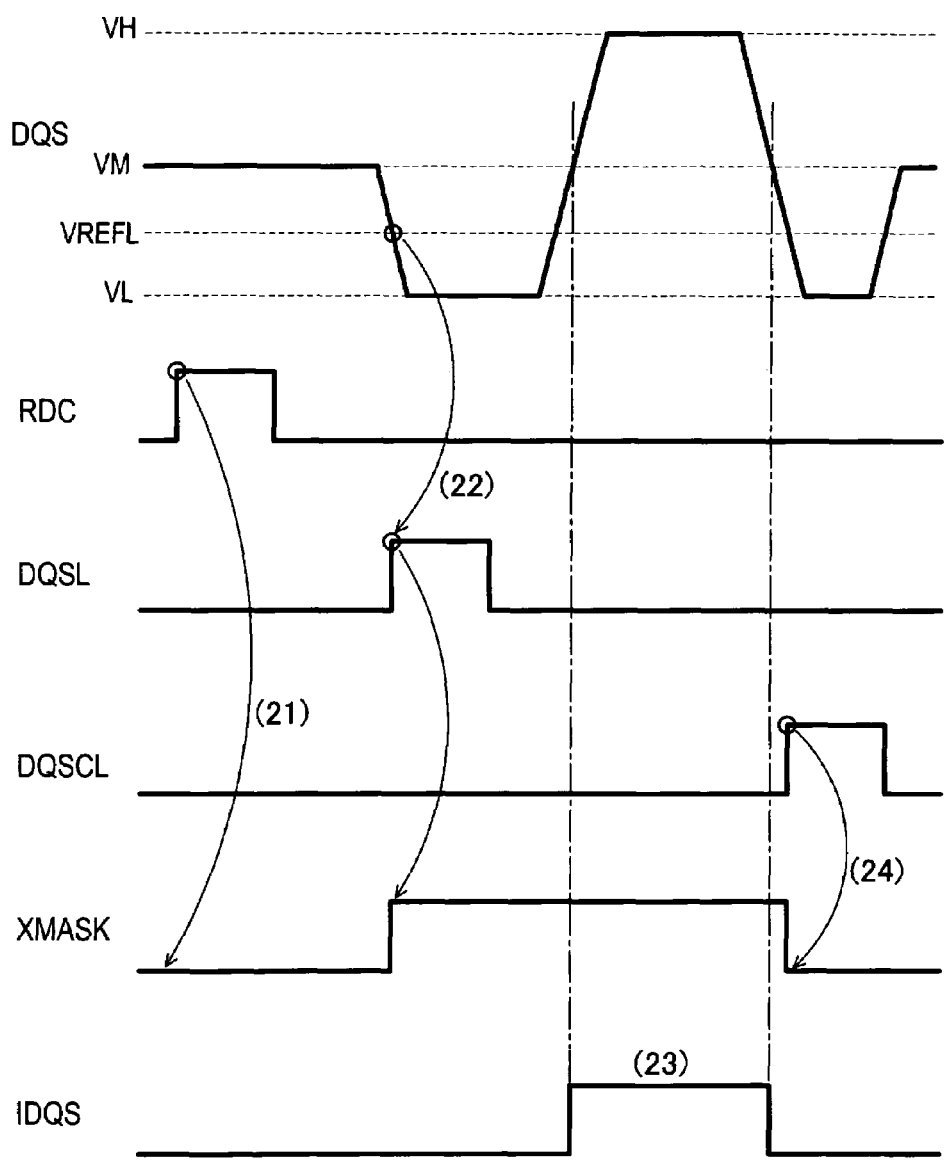
FIG. 6 is a timing chart illustrating the operation of the interface circuit according to the third embodiment.

Next, the operation of the interface circuit 3 of the third embodiment will be described. FIG. 6 is a timing chart illustrating the operation of the interface circuit 3 of the third embodiment.

When, as in (21) the read instruction signal RDC is switched to a high level, the propagation control signal XMASK is switched to a low level. Further, the read instruction signal RDC is a signal which is switched to a high level when a command outputted from a DDR SDRAM controller (not shown) is read.

If, as in (22), the potential of the strobe signal DQS drops below the low potential side threshold potential VREFL, a high level pulse is outputted from the strobe edge signal DQSL. The propagation control signal generating portion 33 is set by a high level pulse of this strobe edge signal DQSL so that the propagation control signal XMASK maintains a high level.

If, as in (23), the potential of the strobe signal DQS exceeds the threshold potential VREF, a high level is outputted to the output of the input comparator 31 and high level is outputted to the internal strobe signal IDQS through the propagating portion 34.

If, as in (24), the propagation control release signal DQSCL is switched to a high level, the propagation control signal generating portion 33 is reset, and the propagation control signal XMASK is maintained at a low level. Consequently, the propagating portion 34 interrupts the output of the comparator 30 and after that, maintains a low level of output.

As a result of the above-described operations, the strobe signal DQS detects a transition of the intermediate potential VM so that the internal strobe signal IDQS is maintained at a low level, thereby preventing acquisition errors in the data acquisition circuit of a DDR SDRAM (not shown), which is connected to a subsequent stage.

Fourth Embodiment

Figure 7:
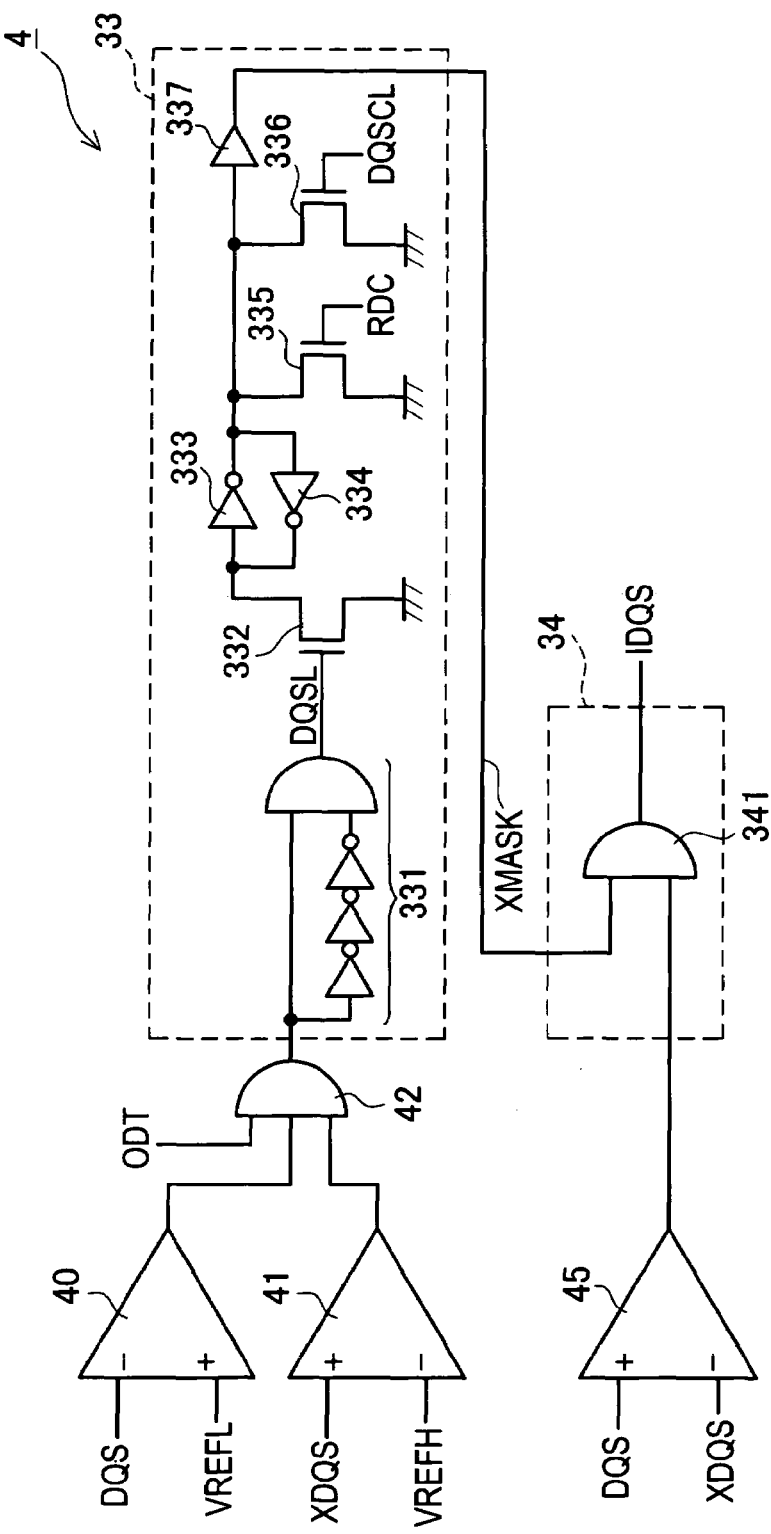
FIG. 7 is a circuit diagram illustrating the structure of an interface circuit according to a fourth embodiment.

Next, the interface circuit 4 of the fourth embodiment will be described. FIG. 7 is a circuit diagram illustrating the structure of the interface circuit 4 of the fourth embodiment. The interface circuit 4 is a circuit which receives inputs of the strobe signal DQS and of the inverting strobe signal XDQS, which is of a level complementary to the strobe signal DQS. The interface circuit 4 then outputs the internal strobe signal IDQS in which propagation of the strobe signal DQS is interrupted during periods in which the strobe signal DQS and the inverting strobe signal XDQS are of intermediate potential VM.

The interface circuit 4 comprises a first comparator 40, a second comparator 41, a 3-input AND gate 42, a propagation control signal generating portion 33, a propagating portion 34 and an input comparator 45. Of them, the propagation control signal generating portion 33 and the propagating portion 34 will not now be explicitly described because they are identical to those that were included in the interface circuit 3 of the third embodiment.

In a first comparator 40, the strobe signal DQS is connected to the inverting terminal (−), and the low potential side threshold potential VREFL is connected to the non-inverting terminal (+). In a second comparator 41, the inverting strobe signal XDQS is connected to the non-inverting terminal (+), and the high potential side threshold potential VREFH is connected to the inverting terminal (−). In a 3-input AND gate 42, the determination control signal ODT inputted from outside is connected to a first input terminal, the output of the first comparator 40 is connected to a second input terminal and the output of the second comparator 41 is connected to a third input terminal.

In this context, the low potential side threshold potential VREFL is set to a potential that is lower than the intermediate potential VM and the high potential side threshold potential VREFH is set to a potential that is higher than the intermediate potential VM.

Figure 8:
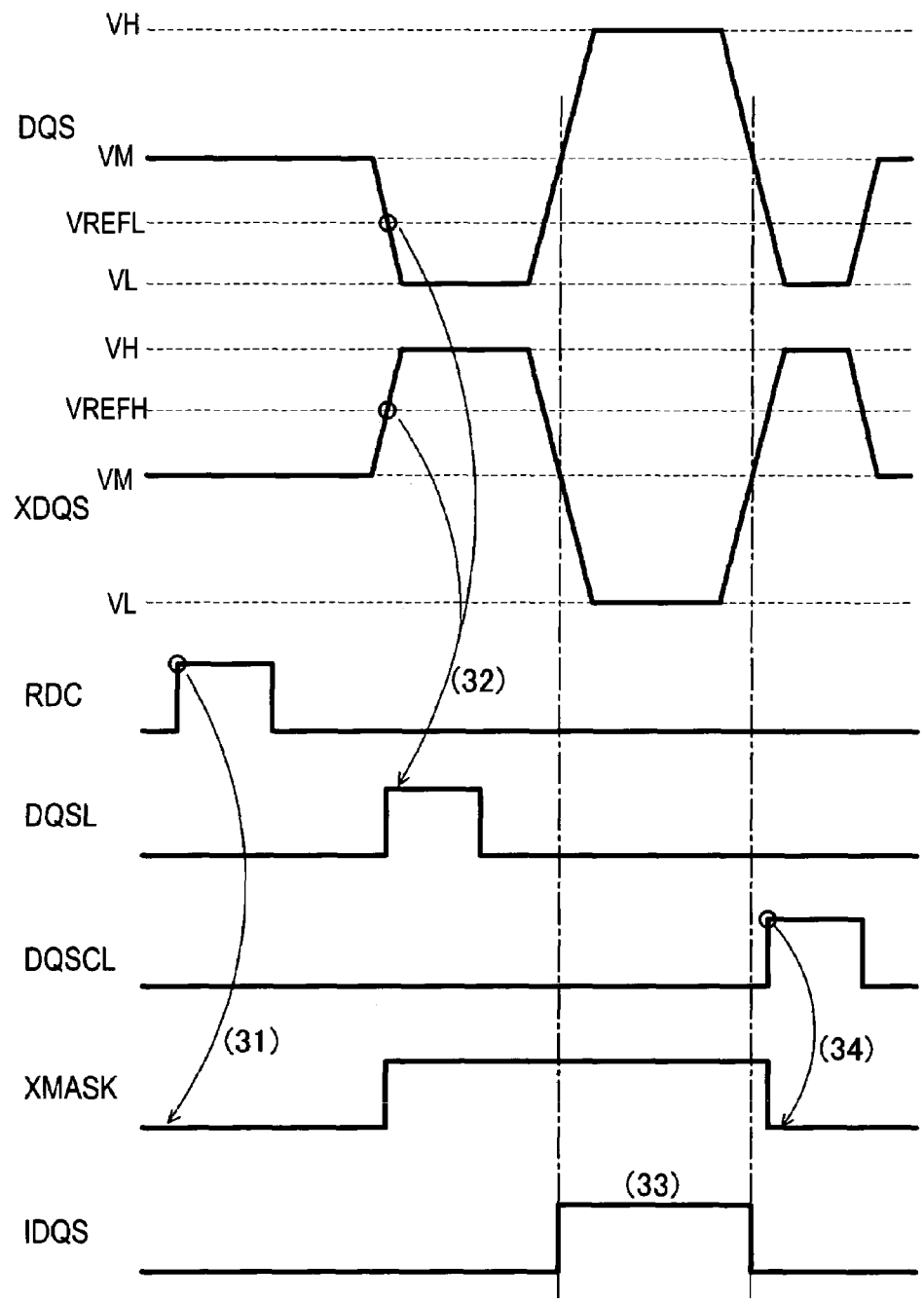
FIG. 8 is a timing chart illustrating the operation of the interface circuit according to the fourth embodiment.
Figure 9:
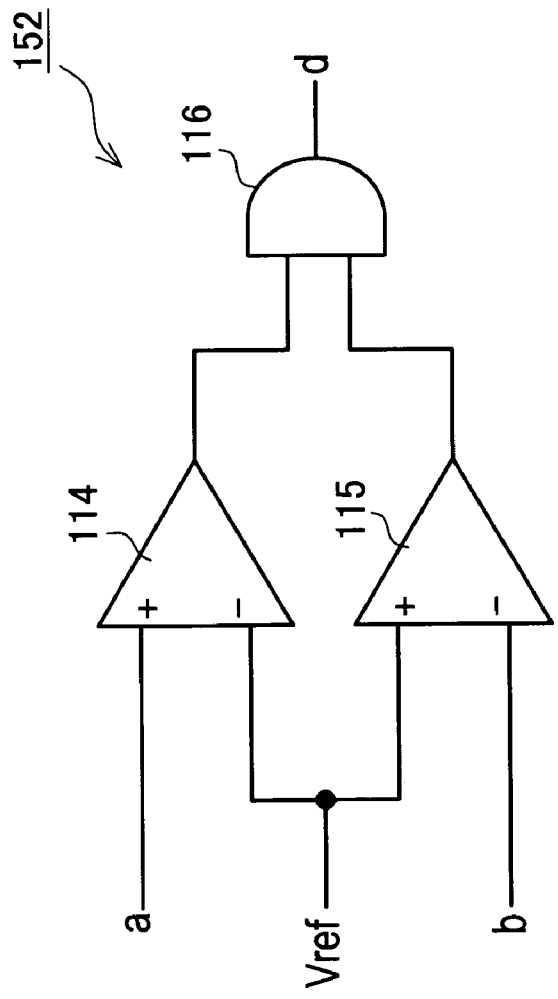
FIG. 9 is a circuit diagram illustrating an input buffer circuit of conventional art.

Next, the operation of the interface circuit 4 of the fourth embodiment will be described. FIG. 8 is a timing chart illustrating the operation of the interface circuit 4 of the fourth embodiment.

If, as in (31), the read instruction signal RDC is switched to a high level, the propagation control signal XMASK is switched to a low level. The read instruction signal RDC is a signal which is switched to a high level when a command outputted from a DDR SDRAM controller (not shown) is read.

Whenever, as in (32), the potential of the strobe signal DQS drops below the low potential side threshold potential VREFL, a high level pulse is outputted from the strobe edge signal DQSL and whenever the potential of the inverting strobe signal XDQS exceeds the high potential side threshold potential VREFH, a high level pulse is outputted from the strobe edge signal DQSL. The propagation control signal generating portion 33 is set by the high level pulse of this strobe edge signal DQSL, and the propagation control signal XMASK is thus maintained at a high level.

If, as in (33), the potential of the strobe signal DQS exceeds the potential of the inverting strobe signal XDQS, a high level is outputted to the output of the input comparator 31 and a high level is outputted to the internal strobe signal IDQS through the propagating portion 34.

If, as in (34), the propagation control release signal DQSCL is switched to a high level, the propagation control signal generating portion 33 is reset and the propagation control signal XMASK is maintained at a low level. Consequently, the propagating portion 34 interrupts the output of the input comparator 45 and after that, output is maintained at a low level.

As a result of the above-described operation, because the strobe signal DQS detects a transition of the intermediate potential VM, and the internal strobe signal IDQS is maintained at a low level, acquisition errors can be prevented in a data acquisition circuit of a DDR SDRAM (not shown), to be connected to a subsequent stage.

Needless to say, the present invention is not restricted to the above-described embodiments, but may be improved or modified in various ways within a scope not departing from the spirit of the invention.

The present invention can for example be applied to a structure having a NOR circuit in which, by switching connections of each input to the non-inverting terminal and to the inverting terminal within the first comparator 20 and the second comparator 21 outputs of the first comparator 20 and the second comparator 21 become negative logic outputs, and the 3-input AND gate 22 can be used as a negative logic input.

The same considerations can be said to apply the first comparator 40, the second comparator 41 and the 3-input AND gate 42.

Although the propagating portion 34 includes an AND gate 341, the present invention can be applied to a structure in as interrupted which, by use of, for example, a switch circuit, propagation of the strobe signal DQS in accordance with the propagation control signal XMASK.

The strobe signal and the inverting strobe signal are examples of signals, the high potential side threshold potential and the low potential side threshold potential are examples of threshold potential, the comparator is an example of a comparing portion and the 3-input AND gate is an example of a determining portion.

An interface circuit for detecting that the potential of a signal line is located at an intermediate potential can be provided by applying the present invention.

What is claimed is:

1. An interface circuit comprising:
    a comparing portion for comparing each complementarily changing potential of complementary signals, each of which is received by the interface circuit with different threshold potentials, each of the threshold potentials being different from an intermediate potential that the complementary signals reach when the complementary signals are an inactive state; and
    a determining portion for determining a state of the complementary signals based on a comparison result of the comparing portion.

2. The interface circuit according to claim 1, wherein the comparing portion comprises a first comparing portion and a second comparing portion,
    wherein the first comparing portion compares a first potential of a first signal included in the complementary signals with a high threshold potential of the differential threshold potentials,
    wherein the second comparing portion compares a second potential of a second signal included in the complementary signals with a low threshold potential which is lower than the high threshold potential and the intermediate potential, and
    wherein a determining portion determines the state based on a determination whether the first potential is higher than the high threshold potential and the second potential is lower than the low threshold potential.

3. The interface circuit according to claim 2 wherein the first signal is a DQS signal from a DDR SDRAM and the second signal is a XDQS signal from the DOR SDRAM.

4. The interface circuit according to claim 1 wherein the determining portion is actuated in accordance with a determination control signal inputted from outside.

5. An interface circuit for transmitting a signal from an external circuit and connected to at least a signal line which reaches an intermediate potential when the signal attains an inactive state, comprising:
    a comparing portion for comparing a potential of the signal line with a threshold potential which is a potential that is different from the intermediate potential;
    a propagation control signal generating portion which, when a transition exceeding the threshold potential of a potential of the signal line is detected by the comparing portion, maintains an outputted propagation control signal in an active state, and in accordance with a propagation control release signal inputted from outside, maintains the propagation control signal in an inactive state; and a propagating portion for propagating the signal in accordance with the propagation control signal.

6. The interface circuit according to claim 5 wherein the propagation control signal generating portion includes a flip-flop in which the propagation control signal is set when a transition exceeding the threshold potential of the potential of the signal line is detected by the comparing portion, and the propagation control signal is reset in accordance with the propagation control release signal.

7. The interface circuit according to claim 5 wherein the signal line transmits a DQS signal from a DDR SDRAM and the comparing portion compares the DQS signal with a low potential side threshold potential which is a potential that is lower than the intermediate potential.

8. The interface circuit according to claim 5 wherein the signal line includes a first signal line for transmitting a DQS signal from a DDR SDRAM and a second signal line for transmitting a XDQS signal which is of a level complementary to the DQS signal, and the comparing portion comprises a first comparator for comparing the DQS signal with a low potential side threshold potential which is a potential that is lower than the intermediate potential, a second comparator for comparing the XDQS signal with a high potential side threshold potential which is a potential that is higher than the intermediate potential and a determining portion for determining that the potential of the DQS signal is lower than the low potential side threshold potential and the potential of the XDQS signal is higher than the high potential side threshold potential.

9. The interface circuit according to claim 8 wherein the determining portion is actuated in accordance with a determination control signal inputted from outside.

10. A data transmitting control method comprising:
receiving complementary signals;
comparing each complementarily changing potential of the complementary signals with different threshold potentials, each of which is different from an intermediate potential which the complementary signals reach when the complementary signals are an inactive state; and
determining a state of the complementary signals based on a comparison result of the comparing.

11. The data transmitting control method according to claim 10,
wherein upon each potential of the complementary signals is compared with the different threshold potentials, a first potential of a first signal included in the complementary signals is compared with a high threshold potential of the differential threshold potentials and a second potential of a second signal included in the complementary signals is compared with a low threshold potential which is lower than the high threshold potential and the intermediate potential, and
wherein the state is determined based on a determination whether the first potential is higher than the high threshold potential and the second potential is lower than the low threshold potential.

12. The data transmitting control method according to claim 11, wherein the first signal is a DQS signal from a DOR SORAM and the second signal is a XDQS signal from the DDR SDRAM.

13. The data transmitting control method according to claim 10 wherein the determining is carried out in accordance with a determination control signal inputted from outside.

14. A data transmitting control method for transmitting a signal from an external circuit and connected to at least a signal line which reaches an intermediate potential when the signal attains an inactive state, comprising:
recognizing that a potential of the signal line is an intermediate potential;
comparing the potential of the signal line with a threshold potential which is a potential that is different from the intermediate potential; and
maintaining an outputted propagation control signal in an active state when a transition exceeding the threshold potential of a potential of the signal line is detected by the comparing portion, and maintaining the propagation control signal in an inactive state in accordance with a propagation control release signal inputted from outside; and
propagating the signal in accordance with the propagation control signal.

15. The data transmitting control method according to claim 14 wherein the signal line transmits a DQS signal from a DDR SORAM and the comparing compares the DQS signal with a low potential side threshold potential which is a potential that is lower than the intermediate potential.

16. The data transmitting control method according to claim 14 wherein the signal line includes a first signal line for transmitting a DQS signal from a DDR SDRAM and a second signal line which is of a level complementary to the DQS signal, and the comparing comprises comparing the DOS signal with a low potential side threshold potential which is a potential that is lower than the intermediate potential, comparing a XDQS signal with a high potential side threshold potential which is a potential that is higher than the intermediate potential and determining whether the potential of the DOS signal is lower than the lower potential side threshold potential and the potential of the XDQS signal is higher than the high potential side threshold potential.

17. The data transmitting control method according to claim 16 wherein the determining is carried out in accordance with a determination control signal inputted from outside.

18. An interface circuit comprising:
a comparing portion for comparing each potential of complementary signals, each of which is received by the interface circuit with different threshold potentials, each of the threshold potentials being different from an intermediate potential that the complementary signals reach when the complementary signals are an inactive state; and
a determining portion for determining a state of the complementary signals based on a comparison result of the comparing portion,
wherein the determining portion is actuated in accordance with a determination control signal inputted from outside.

19. A data transmitting control method comprising:
receiving complementary signals;
comparing each potential of the complementary signals with different threshold potentials, each of which is different from an intermediate potential which the complementary signals reach when the complementary signals are an inactive state; and
determining a state of the complementary signals based on a comparison result of the comparing,
wherein the determining is carried out in accordance with a determination control signal inputted from outside.

* * * * *